June 23, 1970 J. J. STERANKO 3,516,156

CIRCUIT PACKAGE ASSEMBLY PROCESS

Filed Dec. 11, 1967 2 Sheets-Sheet 1

*INVENTOR*
JAMES J. STERANKO

*BY* Carl W. Laumann, Jr
Bernard ... Jr.
ATTORNEYS

United States Patent Office 3,516,156

Patented June 23, 1970

3,516,156

CIRCUIT PACKAGE ASSEMBLY PROCESS

James J. Steranko, Saratoga, Calif., assignor to International Business Machines Corporation, Armonk, N.Y., a corporation of New York Filed Dec. 11, 1967, Ser. No. 689,716
Int. Cl. H01b 13/00; H05k 3/28, 3/30
U.S. Cl. 29—627 5 Claims

ABSTRACT OF THE DISCLOSURE

Disclosed is a voltage distribution package characterized by a plurality of vertically disposed, voltage carrying planes. Electrical connection from one said plane to one surface of the package is accomplished by providing an aperture leading to said plane, feeding a wire into the aperture until it contacts that plane, and then welding the wire to that plane. The aperture is enlarged at each possible junction between the wire and those voltage planes lying between the contacted plane and the surface of the board from which the wire was inserted, thereby insuring insulation at those possible junctions.

BACKGROUND OF THE INVENTION

Field of the invention

This invention relates generally to electrical/electronic circuit packaging and, more particularly, to an electrical potential distribution package. Further, it relates to the more specific problem of bringing a potential out from one or more buried voltage distribution planes to a surface of such a package.

Description of the prior art

Electronic circuit packages comprising sandwiched layers of conductive and insulating materials have been known to the prior art for the past several years—particularly, in computer technology. Much effort has been expended on the problems associated with making these packages satisfactory from both a mechanical and an electrical viewpoint. Not the least of the problems associated with these packages has been the establishment of connections from one surface into the conductive paths, or planes, between the two outer surfaces of a package.

Semiconductive devices today require a plurality of operating voltages. It has proven desirable to mount these semiconductor devices on an electronic package of the type described above. Each conductive plane therein carries a single voltage, and the voltage can be brought up from that plane to proper terminals on the semiconductor device.

As semiconductor devices have grown smaller, more and more of these devices have been positioned on a surface of a single voltage distribution package. Consequently, it is necessary to have additional discrete elements on that surface of such a voltage distribution package so as to bring the necessary voltages up from within the package to the semiconductor devices themselves.

The prior art has resorted to several techniques (e.g. solder-filled holes and electroplating), and these techniques have been satisfactory so long as the grid spacing between elements (or lands) on the upper surface of the voltage distribution package has not gone below a certain limit. Generally, these techniques begin to pose a number of difficulties when the grid spacing reaches .035 of an inch. To bring up discrete connections from within a voltage distribution package to one surface on a grid spacing less than .035 of an inch has been relatively impossible using the conventional techniques known to the prior art. Due to the decreased size of semiconductor devices, it is presently necessary, and desirable, to go to lesser grid spacings (e.g. .025 of an inch). That .010 of an inch decrease in grid spacing has posed real fabrication difficulties.

Even with the grid sizes of the prior art, the prior art techniques have not been entirely satisfactory. Many prior art methods of fabricating these connections to within a voltage distribution package have been done on a parallel basis. That is, a number of connections have been made at one time. Then, if one connection is bad, the entire circuit package has to be destroyed. In addition, the techniques known to the prior art have not lent themselves to making error-free connections at each location.

Accordingly, it is a general object of this invention to improve the circuit packaging art.

A particular object of this invention is to provide a method of assembling circuit packages.

A more particular object of this invention is to provide a method of establishing connections to a conductive plane within a sandwiched electronic circuit package.

Still another object of this invention is to provide an improved electronic circuit package.

Yet another object of this invention is to provide an improved electronic package comprising a plurality of sandwiched voltage distribution planes having discrete connections to individual ones of said planes.

A still further object of this invention is to provide apparatus for more readily fabricating electronic packages.

Yet another object of this invention is to provide improved apparatus for making discrete connections to a voltage distribution package comprising a plurality of conductive planes.

SUMMARY OF THE INVENTION

In accordance with one aspect of my invention, a method is claimed for fabricating a voltage distribution package. Such a package generally comprises alternating layers of conductive planes and insulative boards. Apertures are formed in both the conductive planes and insulative boards before the actual lamination of the package; the apertures are formed according to a predetermined pattern so that access to a particular plane from one surface of the board is available at a particular location. Axially-aligned apertures are formed in all boards and planes above the plane to be contacted. The coplanar elements (conductive planes and insulative boards) are maintained in alignment. A wire is fed serially into each of the apertures. The wire is fed until it contacts the pertinent, exposed conductive plane. At that time, the wire is welded to the exposed conductive plane. During the time the wire is fed into the hole, a test for short circuits (e.g. undesired connections to superposed planes) is performed. If a short circuit is detected, the process is halted until the short circuit inducing condition is corrected. Subsequent to the completion of all weld connections, the assembly is laminated together under heat and pressure. A voltage distribution package with discrete leads, serving to bring voltages up from within the interior of that package to one surface, is thereby formed.

In accordance with another aspect of my invention, a novel circuit package is formed. That package comprises a plurality of laminated members, some conductive and some insulative. In addition, a plurality of discrete connections to various conductive planes within the package are provided. The connections are formed by wire passing through layers of the circuit package, and those wires are insulated from all but the desired conductive plane within the package. The wire is welded to that conductive plane.

Another aspect of my invention resides in apparatus for fabricating a circuit package of the type described above. The apparatus includes means for feeding the connection-forming wire, means for effecting a weld between that wire and the particular conductive plane within the circuit package, means for positioning the wire feeding means over the apertures in the circuit package in a serial fashion, and means for monitoring the connection-forming operation so as to insure the absence of short circuits (i.e. the connection of the wire to more than one plane within the voltage distribution package).

The packaging concept of this invention offers a number of advantages. Of particular interest is the fact that it lends itself to utilization with ever smaller semiconductor devices. A greater number of connections per unit of surface area can be made to buried voltage distribution planes than had been possible. In addition, the quality of the connections so made can be checked before the next connection is made. In this manner, it is possible to avoid the necessity of having to destroy entire packages after all the connections have been made. The apparatus for accomplishing this is relatively simple, yet highly effective. It takes full advantage of certain physical characteristics of the voltage distribution package itself. In addition, it enables the fabrication process to be completely automated, if necessary.

The foregoing and other objects, features and advantages of the invention will be apparent from the following more particular description of the preferred embodiments of the invention as illustrated in the accompanying drawings.

DESCRIPTION OF PREFERRED EMBODIMENTS

Figure 1:
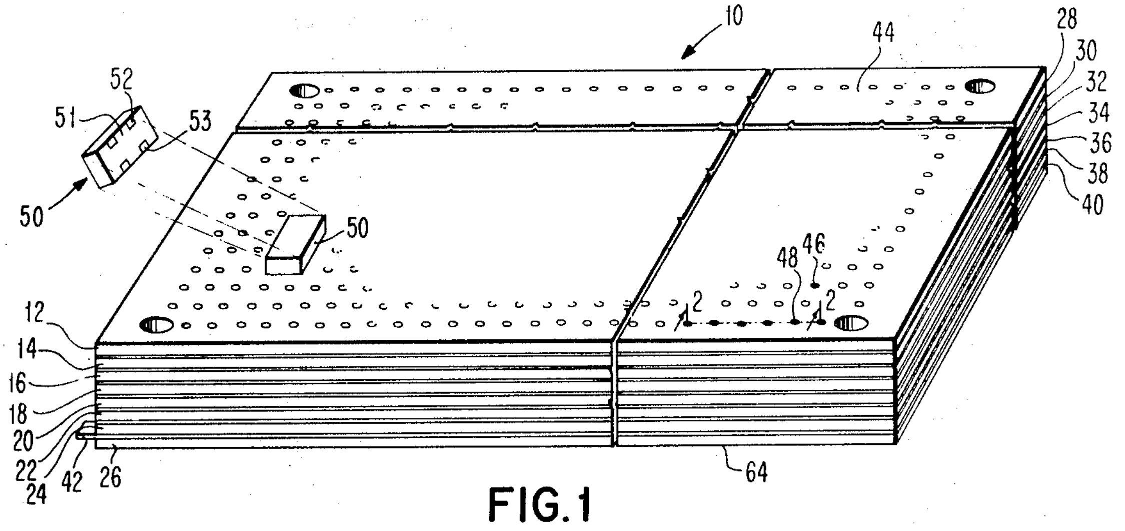
FIG. 1 is an isometric drawing of the novel circuit package of my invention.

FIG. 1 shows the novel electronic package 10 of my invention comprising a plurality of insulative boards 12, 14 through 26 and conductive planes 28, 30 through 40 disposed in a vertical relationship. Package 10 in FIG. 1 has been broken along two axes so as to maintain a more typical spatial relationship among its members. Conductive planes 28–40 carry voltages; these voltages are supplied by a suitable connection to each plane, such as tab 42 shown associated with conductive plane 40. The electrical voltages carried by various conductive planes 28–40 are brought to the upper surface 44 of package 10 by means of an array of conductive pins, only two of which, 46, 48, are numbered. Each such pin contacts only one associated conductive plane and is welded to that plane. Each plane may be contacted by more than one pin. A plurality of devices, such as semiconductor device 50, can then be adhered to the upper surface 44 of voltage distribution package 10; adherence may be by means of a solder connection. By positioning the semiconductor devices over selected pins, proper voltages can be brought up from within package 10 via pins and supplied to the semiconductor devices through contacts on the devices. For example, the lower surface 51 of device 50 is shown by projection and there are contacts, such as contacts 52, 53, thereon. Those contacts 52, 53 are used to establish electrical conductivity between device 50 and selected conductive planes 28–40 by means of pins similar to pins 46, 48.

Figure 2:
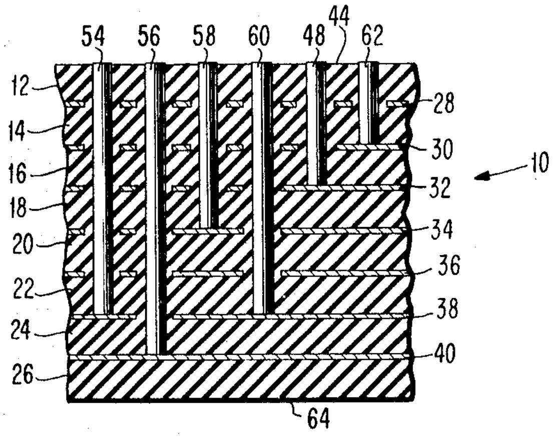
FIG. 2 is a partial cross-sectional view taken along line 2—2 of FIG. 1.

The novel structure of my invention is more fully shown with the aid of FIG. 2, which is a partial sectional view taken along line 2—2 of FIG. 1. The conductive planes and insulative boards of FIG. 1 are shown and similarly numbered. Consider the situation where it is desired to bring a voltage from conductive plane 32 up to surface 44 of package 10. During the fabrication of package 10, which will be more fully described hereafter, axially-aligned apertures are formed in insulative boards 12, 14, 16, as well as conductive planes 28, 30. A pin 48, formed of wire, is inserted in the overall aperture so formed. Pin 48 is welded to conductive plane 32 by apparatus to be described more fully hereafter. Pin 48 is then cut off at the upper surface 44 of package 10. The apertures in conductive planes 28, 30 are made larger than apertures in insulative boards 12, 14, 16 so as to avoid the possibility of undesired short circuits to planes 28, 30. Other pins are shown contacting other conductive planes within package 10. For example, pin 54 contacts conductive plane 38; pin 56 contacts conductive plane 40; pin 58 contacts conductive plane 34; pin 60 contacts conductive plane 38; and, lastly, pin 62 contacts conductive plane 30.

Summarizing the one aspect of my invention, a novel package 10 having connections from one surface 44 to discrete conductive planes 28–40 is disclosed. Each connection extends to one, and only one, conductive plane, but there may be more than one connection to any one plane.

Figure 3:
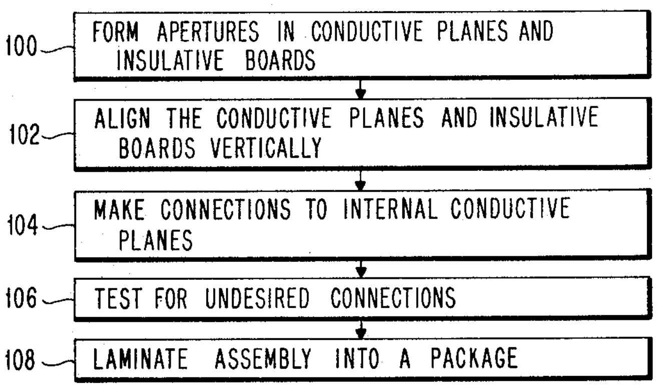
FIG. 3 is a flow chart of the basic steps necessary to practice the method of my invention.

The novel method of fabricating electronic circuit packages according to my invention is outlined in the flow chart of FIG. 3. Box 100 of FIG. 3 shows the first step of forming apertures in conductive planes and insulative boards. Those apertures are formed according to a predetermined pattern, and that pattern is determined by a knowledge of what conductive planes within the electronic circuit package are to be contacted and where they are to be contacted. The cutting of the apertures can be accomplished by several different techniques; for example, stamping by means of a sharpened tool. As shown in box 102, the conductive planes and insulative boards necessary for a single package are brought together and aligned vertically. With reference to box 104, the step of establishing connections to the internal conductive plane is illustrated. This is a welded connection and it is formed by inserting a conductive element, such as a wire, into an aperture until it contacts an internal conductive plane. At that time, a weld is formed between the inserted wire and the contacted plane. Box 106 illustrates the step of testing for undesired connections. (This testing step could be completed prior to, or after, the weld operation of box 104; in the preferred embodiment, it would be done right before the weld was made, and after the insertion of the conductive element.) This, and the preceding steps, will be made clearer with reference to the description of apparatus for practicing the method of my invention presented subsequently. With reference to box 108, the conversion of the various elements into an electronic package is illustrated by the step of laminating the assembly. The insulative boards are of a material which deforms upon application of heat and pressure, and an integral package is thus formed—with the insulative boards flowing into any voids within the interior of the electronic package. The formation of the package could also include the additional step of grinding both surface 44 and the opposite surface 64 (see FIG. 1), plating a conductive metal on both surfaces 44, 64 and then etching a printed circuit pattern in one, or both, surfaces 44, 64. All the steps set forth in boxes 100–108 inclusive will become clearer as apparatus suitable for practicing the novel method of my invention is described in conjunction with FIG. 4.

Figure 4:
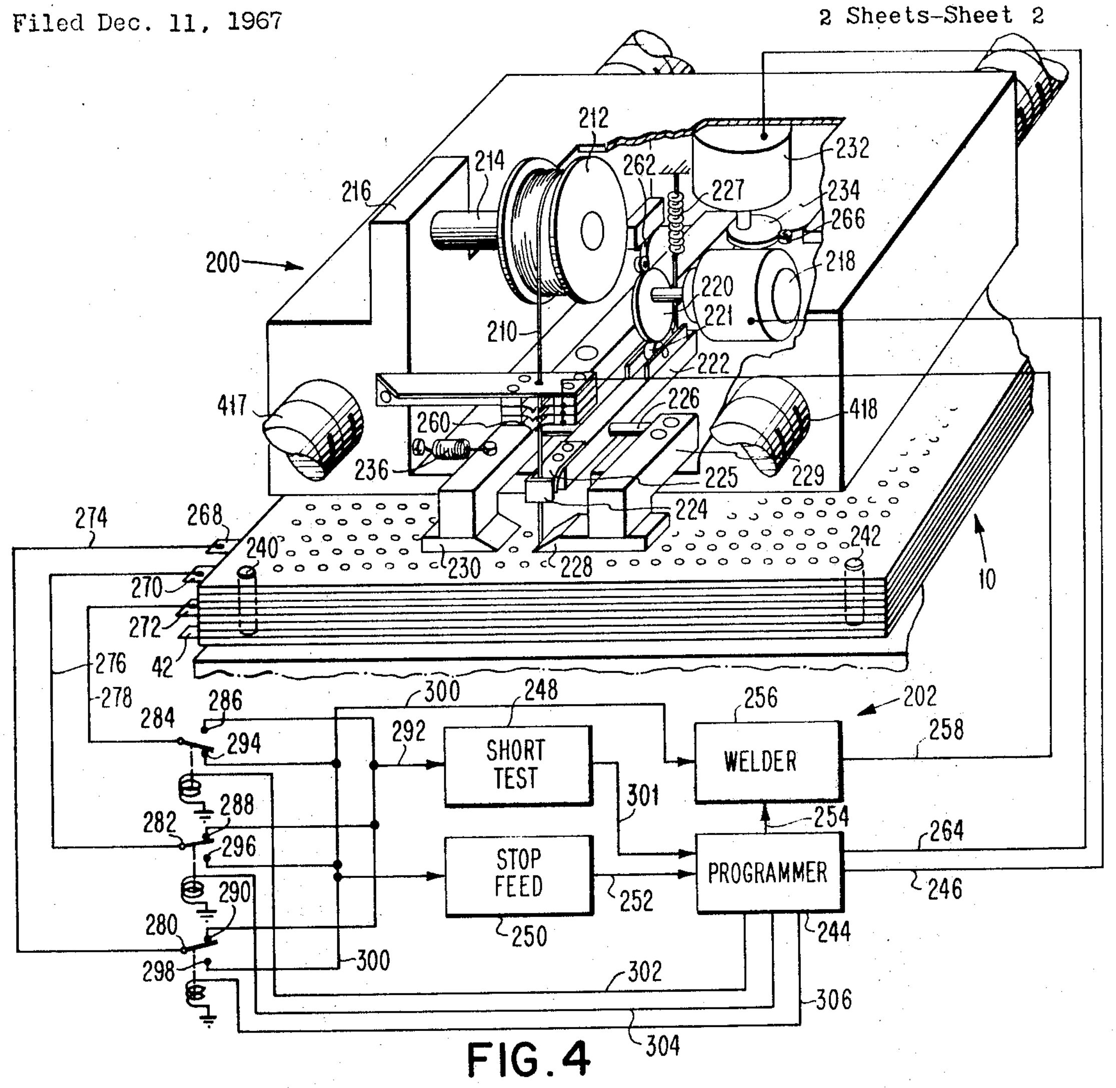
FIG. 4 is a hybrid isometric-schematic drawing of the connection forming mechanism and control circuitry.

Turning to FIG. 4, apparatus including a positionable wire insertion-welding mechanism 200, and associated control circuitry 202, is shown fabricating a package 10 of the type shown in FIG. 1. For clarity, the numbering of the various parts of package 10 used in FIG. 1 has been carried over to FIG. 4.

The purpose of insertion-welding mechanism 200 is to place wire in a desired aperture and weld that wire to a conductive plane. As such, it includes a supply of pin-forming wire 210 mounted on a spool 212 rotatable about shaft 214 affixed at one end to housing 216. It includes apparatus for drawing wire off spool 212. That apparatus includes motor 218, cam 220 driven by that motor 218, cam follower 221, lever 222 having head 224 thereon; lever 222 rotates about shaft 226 mounted in rigid element 229. Spring 227 is associated with lever 222 and connected thereto. A cutting mechanism, including fixed blade 228 and movable blade 230, is controlled by drive motor 232, cam 234, driven by motor 232, and spring 236 connected at one end to housing 216. Control circuit 202 will be introduced in the following description of fabricating a package 10.

With reference to a more particular description of the apparatus shown in FIG. 4, it is necessary first to align vertically the assembly of conductive planes and insulative boards so as to insure the proper disposition of the apertures therein. This vertical alignment can be effected by providing apertures specifically for this purpose and then inserting aligning elements at each of the corners of package 10 (elements 240, 242 are shown) during the fabrication process. Apparatus 200 is positioned by movement in an X–Y direction so that wire 210 is positioned over a desired aperture. Programmer 244 then sends a signal on line 246 to motor 218, and motor 218 drives associated cam 220 into engagement with cam follower 221 on lever 222. Associated spring 227 exerts an upward force on lever 222 which is overcome by cam 220. As cam 220 rotates toward its low point, spring 227 pivots lever 222 about shaft 226 and head 224 of lever 222 moves downward toward package 10. Wire 210, held tightly by tensioned member 225, is thereby inserted into the desired aperture in package 10 as spool 212 rotates. As wire 210 is being fed into the desired apertures, welder 256, with short test circuitry 248, is continuously monitoring the resistance between wire 210 and the conductive planes to which no connection is desired; this will be described more fully hereinafter. If a short circuit is sensed, programmer 244 immediately stops feed motor 218 by a second signal on line 246 so that wire 210 can be withdrawn from the aperture by the operator and the condition remedied. This can be accomplished, for example, by manually lifting head 224 and rotating spool 212 to compensate for slack in wire 210. The force exerted by member 225 on wire 210 will lift it up so long as wire 210 has not been welded to a conductive plane. It is then necessary to repair the "short" condition and this can be accomplished by reaming, for example. Assuming that no short circuit is sensed, or that a sensed short has been repaired, the drive mechanism, including motor 218, continues to push wire 210 downwardly into the aperture until the desired conductive plane is contacted. At this point, a stop feed signal is generated by circuitry 250 on line 252 to programmer 244. This will be made clearer in the next paragraph where circuitry 202 is more fully described. Programmer 244 then, by means of a signal on line 246, stops the operation of motor 218. Programmer 244 sends a signal on line 254 to welder circuitry 256, which generates a current pulse on line 258 leading to leaf springs 260 which contact wire 210. This current pulse completes a circuit through wire 210 and the plane contacted by that wire so as to effect a weld between wire 210 and the particular conductive plane. Motor 218 is reenergized; cam 220 continues to rotate to its high point, overcoming spring 227, and head 224 thereby moves upwardly. Since the end of wire 210 is now affixed to the particular conductive plane, wire 210 merely slips through head 224, essentially, a one-way clutch. Cam 220 contacts switch 262; motor 218 is thereby stopped; and programmer 244 sends a signal on line 264. That signal on line 264 energizes motor 232. Energization of motor 232 causes its associated cam 234 to rotate and thereby moves blade 230 laterally in a direction opposite to that of the force exerted by spring 236. Cutting edges 228, 230 are brought into contact with each other, thereby severing wire 210 at a point slightly above the upper surface 44 of package 10. Motor 232 continues to rotate, as does its associated cam 234. When the high point of cam 234 reaches switch 266, it is closed, thereby deenergizing motor 232 through associated conventional circuitry, not shown for simplicity's sake. Apparatus 200 may then be indexed to a second aperture, and the cycle of operation, described above, repeated. Head assembly 224 is designed so as to grip and pull wire 210 as head 224 moves downward; the automatic feeding of wire 210 from spool 212 is thereby effected.

The description of the apparatus set forth in FIG. 4 would not be complete unless a more thorough description of associated circuitry 202 was presented. With that in mind, note that each of the conductive planes in package 10 has a connecting tab, such as tabs 268, 270, 272. During the fabrication operation, a wire 274, 276, 278 goes from each of those tabs 268, 270, 272 to the pole 280, 282, 284 of an associated relay. One contact of each relay goes to the short test circuitry 248; for example, contacts 286, 288, 290 are joined on line 292 to short test circuitry 248. The other contact point of each relay is commonly connected to stop feed circuitry 250; for example, contact points 294, 296, 298 are joined by common line 300 to stop feed circuitry 250. In addition, line 300 leads to welder circuit 256. During a given cycle of operation, the relay associated with the conductive plane to which contact is to be made is set so that its contact is connected to the stop feed circuitry 250. All the other relays are set so that their contacts are connected to short test circuitry 248. This relay setting can be accomplished by signals from programmer 244 on lines 302, 304, 306. Should a short circuit be present, one of the relays connected to short test circuitry 248 will serve to bring a voltage from the "shorted" conductive plane to the short test circuitry 248 and it, in turn, generates a signal on line 301 to programmer 244 so as to halt the operation of the remaining portion of the cycle. If no short circuit is detected, motor 218 drives until the stop feed signal is generated, at which point the fed is cut off, the welder is pulsed through concurrence of signals on lines 254 and 300, and the wire 210 sheared. Note that only three tabs, three relays, etc, have been described for simplicity's sake. Circuitry 202 can be expanded in accordance with the number of conductive planes in package 10.

Figure 5:
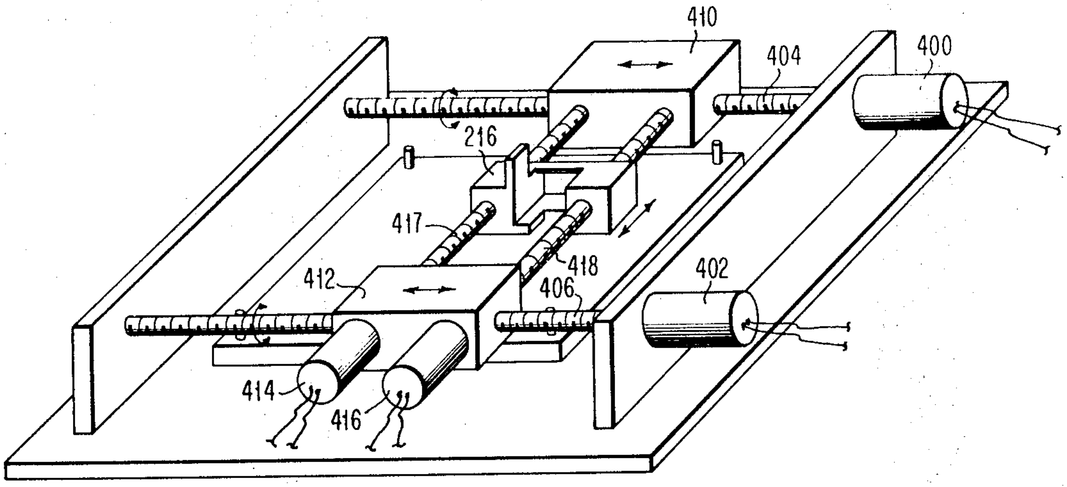
FIG. 5 is an isometric view of a positioning table for the mechanism of FIG. 4.

It is necessary to position apparatus 200 in a direction defined by X–Y coordinates over package 10. The apparatus of FIG. 5 is one suitable way of accomplishing this, although many other positioning apparatus are available. This apparatus shown includes a pair of electrical stepping motors 400, 402 driven in synchronism so as to rotate lead screws 404, 406. Two elements 410, 412 ride on lead screws 404, 406. Elements 410, 412 are driven in the X direction by lead screws 404, 406. Y-drive motors 414, 416 are geared to drive a pair of lead screws 417, 418 for movement in the Y-direction. The basic framework for the pin insertion mechanism (i.e. housing 216) rides on lead screws 417, 418 for movement in the Y direction. Movement in the X direction is accomplished by movement of elements 410, 412. Thus, if a proper pulse signal is applied to X drive motors 400, 402 and Y drive motors 414, 416, the pin (or wire) insertion mechanism 200 may be positioned over any desired wire location.

The above examples of my invention have been directed to the fabrication of a circuit package for distributing voltages. It should be recognized that the conductive planes shown in the above examples may carry currents as well as voltages. In addition, the planes may comprise discrete conductive paths, as opposed to an integral, generally rectangular-shaped piece of conductive material. Further, the conductive plane may be of any shape—rectangular, circular or otherwise. The conductive planes may be formed of any electrically conductive material; however, in the preferred embodiment, they would be copper. Similarly, the insulative boards may be of any deformable insulative material. In the preferred embodiment, they would be of a fibrous substance, such as glass cloth impregnated with a phenolic resin. The wire used for insertion in the apertures of the package can also be of several different types. In the preferred embodiment, it is gold-plated copper. However, it may be of any conductive material offering the necessary rigidity for handling. In the preferred embodiment, the wire is roughly .008 of an inch in diameter. Similarly, the size is not critical, although the invention is admittedly more practical for fabricating miniaturized circuit packages. The wire may even be insulated. As the shearing operation is performed, a certain amount of insulation would be removed from the wire so that the upper surface of the connection so formed is exposed and the lower surface of the next segment of wire is similarly exposed for subsequent welding. The weld circuitry could comprise any suitable power supply capable of supplying sufficient current to effect a weld between the wire and the conductive plane in question. Commercially available weld equipment such as that manufactured by the Hughes Co. is satisfactory; the characteristics of the weld equipment being dependent on the properties of the materials being welded. The functions of short test circuitry 248, stop feed circuitry 250 and programmer 244 can be implemented on many types of commercially available digital computers; e.g. the IBM 1800 Process Control Computer. Alternatively, simple arrangements of logic circuitry could be especially designed for these functions by one skilled in the art of logic design. It should also be recognized that the terms "conductive planes" and "insulative boards" have been used primarily for purposes of description; it is not meant to imply any limitation as to dimensional thickness, etc. Those terms are used in the claims also to differentiate between the elements of this invention. Note that pins may, in one embodiment, extend from one surface all the way through the package to a second, opposed (and conductive) surface.

While the invention has been particularly shown and described with reference to preferred embodiments thereof, it will be understood by those skilled in the art that the foregoing and other changes in the form and details may be made therein without departing from the spirit and scope of the invention.

What is claimed is:

1. The method of making connections to discrete conductive planes in a circuit package comprising the steps of:

aligning plural apertured conductive planes, internal to said package, and plural apertured insulative boards so that apertures extend from one surface of said package to individual ones of said conductive planes at each desired connection point, said planes extending to at least one edge of the package to form electrical access points at said edge;

engaging conductive wires with respective conductive planes at connection points by inserting said conductive wires into the apertures and welding said conductive wires to said respective conductive planes by passing current through the respective planes by way of said access points and through said wires; and joining the insulative boards together to form an integral welded wire-conductive plane package.

2. A method according to claim 1 and including the additional step of severing said conductive wire at a point near the surface of said package.

3. A method according to claim 1 wherein the insulative material is heat-pressure flowable and the joining step comprises flowing the insulative board material around the welded composite by heat-pressure laminating.

4. A method according to claim 3 and including the additional step of:

removing the portions of said conductive wires which project above said surface of said package.

5. A method according to claim 1 including the step of:

determining whether electrical contact exists between said wire and said planes by electrically energizing said wire and said access points.

References Cited

UNITED STATES PATENTS

| | | | |
|---|---|---|---|
| 2,569,059 | 9/1951 | Huff et al. | 219—107 |
| 3,264,524 | 8/1966 | Dahlgren et al. | 29—626 XR |
| 3,353,263 | 11/1967 | Helms | 29—626 |
| 3,356,786 | 12/1967 | Helms | 29—626 |
| 3,361,869 | 1/1968 | Gulbier et al. | 29—626 XR |
| 3,375,323 | 3/1968 | Mayhew | 29—626 |

CHARLIE T. MOON, Primary Examiner

R. W. CHURCH, Assistant Examiner

U.S. Cl. X.R.

29—626, 628; 174—68.5; 219—58, 78, 103, 107; 317—101; 339—17